(12) United States Patent
Hsieh

(10) Patent No.: US 11,621,384 B2
(45) Date of Patent: *Apr. 4, 2023

(54) LIGHT-EMITTING DEVICE AND MANUFACTURING METHOD THEREOF

(71) Applicant: EPISTAR CORPORATION, Hsinchu (TW)

(72) Inventor: Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/165,886

(22) Filed: Feb. 2, 2021

(65) Prior Publication Data

US 2021/0159379 A1    May 27, 2021

Related U.S. Application Data

(63) Continuation of application No. 16/411,145, filed on May 14, 2019, now Pat. No. 10,923,641.

(60) Provisional application No. 62/697,387, filed on Jul. 12, 2018, provisional application No. 62/670,900, filed on May 14, 2018.

(51) Int. Cl.
*H01L 33/62* (2010.01)

(52) U.S. Cl.
CPC ...... *H01L 33/62* (2013.01); *H01L 2933/0033* (2013.01); *H01L 2933/0066* (2013.01)

(58) Field of Classification Search
CPC ............ H01L 33/62; H01L 2933/0033; H01L 2933/0066; H01L 2224/73204; H01L 2224/81; H01L 2224/81005; H01L 2224/83192; H01L 2224/95; H01L 25/0753; H01L 33/005; H01L 27/156; H01L 33/20; H01L 33/36

See application file for complete search history.

(56) References Cited

U.S. PATENT DOCUMENTS

| | | |
|---|---|---|
| 4,535,219 A | 8/1985 | Sliwa |
| 6,872,635 B2 | 3/2005 | Hayashi et al. |
| 8,361,268 B2 | 1/2013 | Mizuno et al. |
| 8,476,826 B2 | 7/2013 | Oohata et al. |
| 9,862,141 B2 | 1/2018 | Marinov et al. |
| 10,177,124 B1* | 1/2019 | Huang ............... H01L 33/502 |
| 10,755,958 B2 | 8/2020 | Arai et al. |
| 10,923,641 B2* | 2/2021 | Hsieh ............... H01L 25/0753 |
| 2017/0207284 A1* | 7/2017 | Dykaar ............ H01L 27/3293 |

(Continued)

FOREIGN PATENT DOCUMENTS

WO    2017123780 A1    7/2017

*Primary Examiner* — Thanh T Nguyen
(74) *Attorney, Agent, or Firm* — Huan-Yi Lin

(57) ABSTRACT

This disclosure discloses a method of manufacturing a light-emitting device includes steps of providing a first substrate with a plurality of first light-emitting elements and adhesive units arranged thereon, providing a second substrate with a first group of second light-emitting elements and a second group of second light-emitting elements arranged thereon, and connecting the a second group of second light-emitting elements and the adhesive units. The first light-emitting elements and the first group of second light-emitting elements are partially or wholly overlapped with each other during connecting the second group of second light-emitting elements and the adhesive units.

20 Claims, 18 Drawing Sheets

(56) References Cited

U.S. PATENT DOCUMENTS

2018/0130683 A1     5/2018  Hendriks et al.
2019/0043843 A1*    2/2019  Liu ......................... H01L 24/00
2019/0304346 A1*   10/2019  Choi ....................... H01L 33/60

* cited by examiner

LIGHT-EMITTING DEVICE AND MANUFACTURING METHOD THEREOF

REFERENCE TO RELATED APPLICATION

This application is a continuation of Ser. No. 16/411,145, filed on May 14, 2019, which claims the benefit of Provisional Application Ser. No. 62/670,900, filed on May 14, 2018 and Provisional Application Ser. No. 62/697,387, filed on Jul. 12, 2018, the content of which is hereby incorporated by reference in its entirety.

BACKGROUND

Technical Field

The present disclosure relates to a light-emitting device and its manufacturing method, especially to a method of transferring a large number of light-emitting elements.

Description of the Related Art

The Light-emitting diodes have been widely used in various applications, such as the pixels in a display and light sources in a backlight module. In the process of manufacturing the display and the backlight module, how to efficiently arrange the numerous light-emitting diodes on the circuit board of the display or the backlight module is a problem.

SUMMARY OF THE DISCLOSURE

This disclosure discloses a method of manufacturing a light-emitting device comprising providing a first substrate, forming a first adhesive unit on the first substrate, forming a first light-emitting element on the first substrate, providing a second substrate, forming a second light-emitting element on the second substrate, forming a third light-emitting element on the second substrate, and connecting the second light-emitting element to the first adhesive unit. The third light-emitting element is overlapped with the first light-emitting element during connecting the second light-emitting element to the first adhesive unit.

This disclosure discloses a method of manufacturing a light-emitting device comprising providing a first substrate, forming a first adhesive unit on the first substrate, forming a first light-emitting element on the first substrate, providing a second substrate comprising an intermediate layer, forming a second light-emitting element on the second substrate, forming a first protrusion to push the second light-emitting element toward the first substrate and connecting the second light-emitting element to the first adhesive unit.

This disclosure discloses method of manufacturing a light-emitting device comprising providing a first substrate, forming a first adhesive unit and a second adhesive unit on the first substrate, forming a first light-emitting element on the first substrate, providing a second substrate, forming a second light-emitting element on the second substrate, forming a first protrusion to push the second light-emitting element toward the first substrate and connecting the second light-emitting element to the first adhesive unit and the second adhesive unit.

BRIEF DESCRIPTION OF THE DRAWING

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure accompanied with the drawings.

Figure 1A:
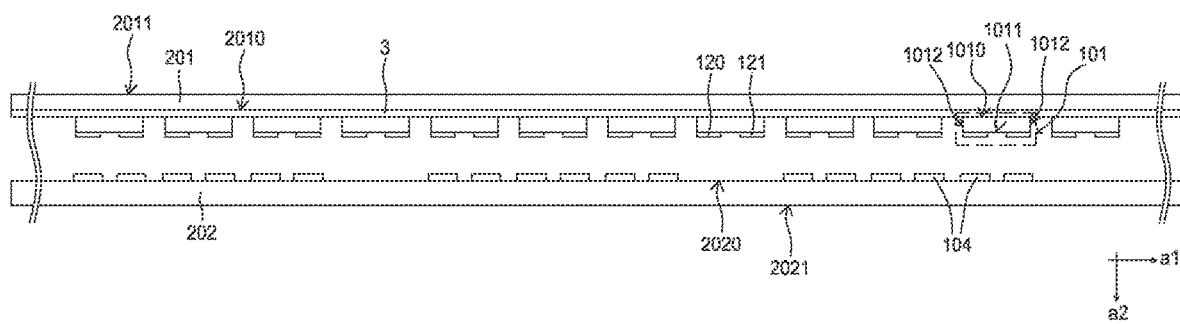
FIGS. 1A~1C show schematic views of manufacturing a light-emitting device in accordance with one embodiment of the present disclosure.
Figure 1B:
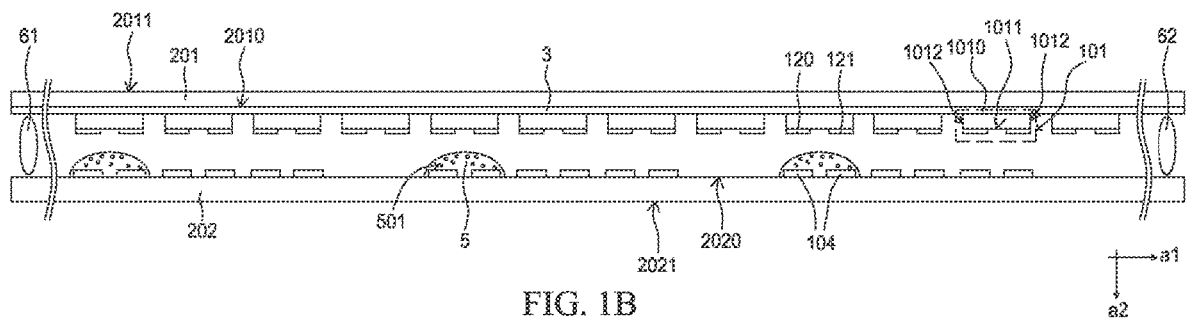
Figure 1C:
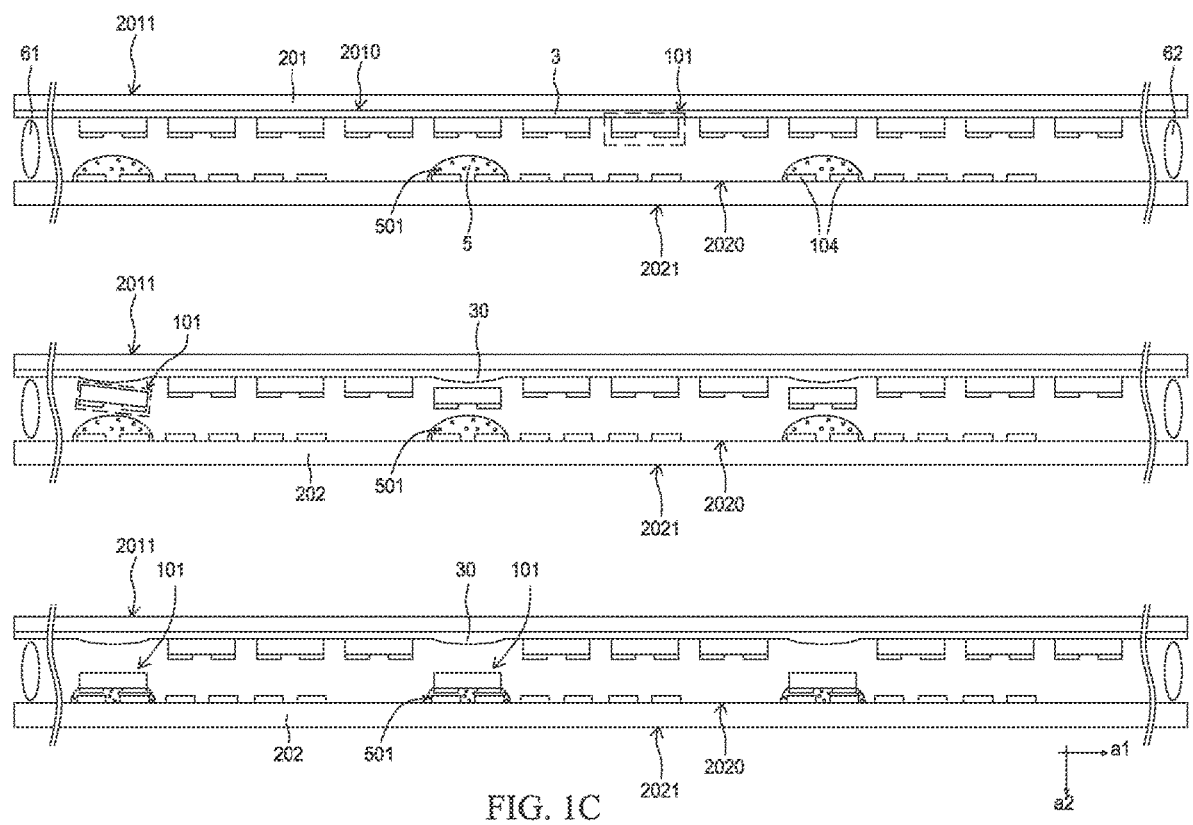

FIGS. 1A~1C show schematic views of manufacturing a light-emitting device in accordance with one embodiment of the present disclosure. The light-emitting device is, for example, a display using LED chips, LED packages, and/or LED CSPs (Chip Scale Package) as pixels, or a backlight module using LED chips, LED packages, and/or LED CSPs as light sources. The manufacturing method of this embodiment includes a process that can efficiently transfer a large number of LED chips, LED packages, and/or LED CSPs to the backplane of the display, the backplane of a backlight module or a predetermined carrier.

Referring to FIG. 1A, multiple first light-emitting elements 101 are arranged on a first substrate 201 through an intermediate layer 3. To be specific, the first substrate 201 has a first lower surface 2010 and a first upper surface 2011, and the first light-emitting elements 101 are arranged on the first lower surface 2010 through the intermediate layer 3. In this embodiment, the light-emitting element can be LED chip, LED packages, and/or LED CSP. The intermediate layer 3 may continuously or intermittently cover the first lower surface 2010 of the first substrate 201. For example, the intermediate layer 3 covers almost or all of the area of the first lower surface 2010, or covers only the area of the first lower surface 2010 corresponding to the first light-emitting element 101. The first light-emitting element 101 has a substrate (not shown), a p-type semiconductor layer (not shown), an n-type semiconductor layer (not shown), a light-emitting layer (not shown), a first electrode pad 120, and a second electrode pad 121. In an embodiment, there is no substrate (for example, growth substrate) included in the first light-emitting element 101. Besides, the first light-emitting element 101 has a top surface 1010, a bottom surface 1011 opposite to the top surface 1010, and a side surface 1012 arranged between the top surface 1010 and the bottom surface 1011. The top surface 1010 of the first light-emitting element 101 is connected to the intermediate layer 3. In an embodiment, the bottom surface 1011 is not a flat surface but is a stepped surface composed of a surface of the p-type semiconductor layer, a surface of the n-type semiconductor, and a surface of the light-emitting layer. The first and second electrode pads 120, 121 are electrically connected to the p-type semiconductor layer and the n-type semiconductor layer respectively.

Referring to FIG. 1A, the second substrate 202 has a second lower surface 2021 and a second upper surface 2020 and faces the bottom surface 1011. There is a plurality of connecting pads 104 disposed on the second upper surface 2020. The connecting pads 104 are configured to electrically connect to the first and second electrode pads 120, 121, and to connect the first light-emitting element 101 to power (not shown) and/or the control circuit (not shown). The first light-emitting elements 101 are moved to the second substrate 202 and electrically connected to the plurality of connecting pads 104 in the subsequent processes shown in FIGS. 1B and 1C.

In an embodiment, the first light-emitting element 101 includes a semiconductor layer including III-V group semiconductor material to emit an incoherent light. The II-V group semiconductor material can be $Al_xIn_yGa_{(1-x-y)}N$ or $Al_xIn_yGa_{(1-x-y)}P$, wherein $0 \leq x, y \leq 1$; $(x+y) \leq 1$. The first light-emitting element 101 can emit a red light with a peak wavelength or dominant wavelength of 610~650 nm, emit a green light with a peak wavelength or dominant wavelength of 495~570 nm, emit a blue light with a peak wavelength or dominant wavelength of 450~495 nm, emit a purple light with a peak wavelength or dominant wavelength of 400~440 nm, or emit a UV light with a peak wavelength of 200~400 nm based on different semiconductor materials. In an embodiment, the first light-emitting element 101 has a light-emitting layer and a wavelength conversion material arranged on the light-emitting layer. The wavelength conversion material has one or more of phosphor, quantum dot material, or combinations thereof. The phosphor can be yellow-greenish phosphor, red phosphor, or blue phosphor. The yellow-greenish phosphor includes YAG, TAG, silicate, vanadate, alkaline-earth metal selenide, or metal nitride. The red phosphor includes fluoride ($K_2TiF_6:Mn^{4+}$, $K_2SiF_6:Mn^{4+}$), silicate, vanadate, alkaline-earth metal sulfide, oxynitride, or a mixture of tungstate and molybdate. The blue phosphor includes $BaMgAl_{10}O_{17}:Eu^{2+}$. The quantum dot material can be ZnS, ZnSe, ZnTe, ZnO, CdS, CdSe, CdTe, GaN, GaP, GaSe, GaSb, GaAs, AlN, AlP, AlAs, InP, InAs, Te, PbS, InSb, PbTe, PbSe, SbTe, ZnCdSeS, CuInS, $CsPbCl_3$, $CsPbBr_3$, $CsPbI_3$. In an embodiment, the first light-emitting element 101 including a wavelength conversion material can emit a white light, wherein the white light has a color temperature between 10000K and 20000K, and has a color point coordinate (x,y) in the CIE 1931 chromaticity diagram, wherein $0.27 \leq x \leq 0.285$; $0.23 \leq y \leq 0.26$. In one embodiment, the white light emitted by the first light-emitting element 101 has a color temperature between 2200K and 6500K (for example, 2200K, 2400K, 2700K, 3000K, 5700K, 6500K) and has a color point coordinate (x, y) located in the 7-step MacAdam ellipse in the CIE1931 chromaticity diagram.

The first substrate 201 is a substrate configured to carry the light-emitting elements. In an embodiment, the first substrate 201 is a substrate that can be entirely or partially restored after being stretched or being bent, for example, a blue tape. In an embodiment, the first substrate 201 is a solid substrate that cannot be recovered after being deformed at room temperature, such as a sapphire substrate. The second substrate 202 is a substrate configured to receive the light-emitting elements transferred from the first substrate 201. In an embodiment, the second substrate 202 is a PCB (Printed Circuit Board) including conductive material and insulating material. The conductive material can be copper, tin, gold or aluminum. The insulating material can be epoxy, glass fiber, alumina, aluminum nitride or combinations thereof. In an embodiment, the connecting pad 104 has titanium, chromium, platinum, copper, nickel, gold, tin or alloys thereof. The connecting pad 104 can be single layer or multiple layers. In an embodiment, the second substrate 202 is a backplane of a backlight module or a backplane of a display.

Referring to FIG. 1B, multiple adhesive units 5 are arranged to cover more than two connecting pads 104. The adhesive unit 5 includes insulating material and conductive particles 501 dispersed within. As shown in FIG. 1B, there are two spacers 61, 62 optionally arranged between the first substrate 201 and the second substrate 202 to keep a distance between the first substrate 201 and the second substrate 202 in order to avoid the first light-emitting element 101 from directly contacting the connecting pad 104 or the adhesive unit 5 before being separated from the first substrate 201. In an embodiment, the distance between the first substrate 201 and the second substrate 202 kept by the spacers 61, 62 is larger than twice of the height of the first light-emitting element 101. In another embodiment, the distance between the first substrate 201 and the second substrate 202 can be maintained by other mechanism so the spacer may be omitted. In an embodiment, the spacers 61, 62 are arranged on edge portions and/or central portions of the second substrate 202. In another embodiment, one or more spacers (not shown) are arranged between the spacers 61, 62. In an embodiment, the spacers 61, 62 are formed on the first substrate 201 or on the second substrate 202 before transferring the first light-emitting elements 101. The spacers can be arranged to form various patterns on the substrate, and related descriptions can be referred to FIGS. 6A~6C and related paragraphs.

Figure 1D:
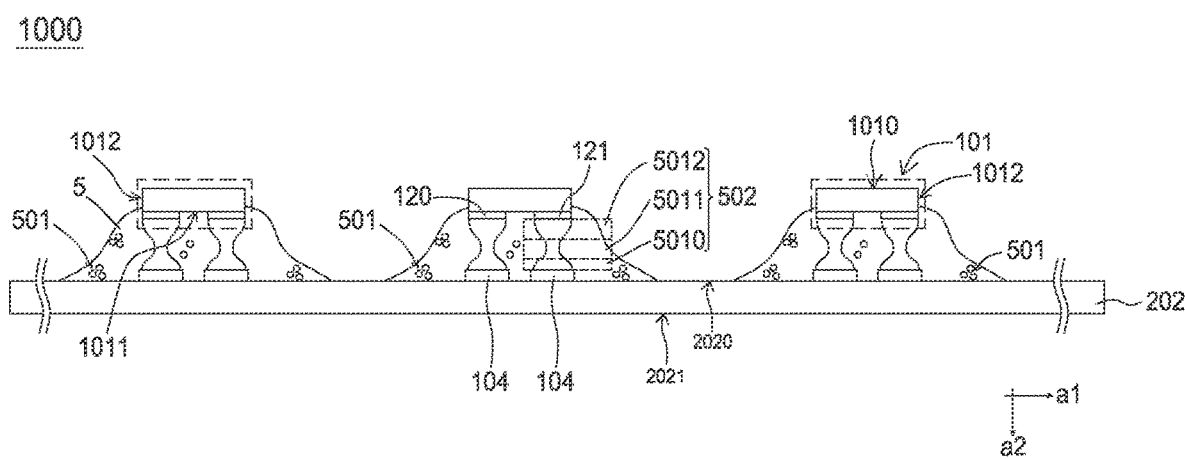
FIG. 1D shows a schematic view of a light-emitting device in accordance with one embodiment of the present disclosure.

The adhesive unit 5 physically and electrically connects the first light-emitting element 101 and the connecting pad 104. The adhesive unit 5 includes insulating material and conductive particles 501 dispersed within. The conductive particles 501 can be aggregated on the connecting pads 104 and on the first and second electrode pads 120, 121 by heating. The first light-emitting element 101 can be electrically connected to the connecting pad 104 through the aggregated conductive particles 501 within the insulating material of adhesive unit 5. The insulating material can be silicone, epoxy or the like. The material of the conductive particle 501 can be tin, copper, silver, gold or the like. To be more specific, the aggregated conductive particles 501 form a conductive pillar 502 connecting the electrode pads and the connecting pads as shown in FIG. 1D. In the embodiment, the thickness of the adhesive unit 5 after connecting with the first light-emitting element 101 is less than 5 μm. In another embodiment, the thickness of the adhesive unit 5 after connecting with the first light-emitting element 101 is larger than 3 μm. In further another embodiment, the thickness of the adhesive unit 5 after connecting with the first light-emitting element 101 is between 1 μm and 4 μm. In the embodiments, the adhesive unit is an ACP (anisotropic conductive paste) or an ACF (anisotropic conductive film).

In an embodiment, the adhesive unit 5 is composed only of insulating material. A metal structure (not shown) is formed on a surface of the first and second electrode pads 120, 121 facing the connecting pad 104. The metal structure can be single layer or multiple layers. The metal structure is deformed to electrically and physically connect to the connecting pad 104 and the first and second electrode pads 120, 121 after being heated and/or pressed, so the deformed metal structure forms the electrical connection path between the connecting pad 104 and the first and second electrode pads 120, 121. In an embodiment, the metal structure includes lead, tin, indium, gold or alloys thereof. Before the connection pad 104 is covered by the adhesive unit 5, the surface of the connection pad and the surface of the metal structure can be oxidized so there is oxide formed thereon. When the adhesive unit 5 is flux, the adhesive unit 5 can remove the oxide on the surface of the metal structure and the oxide on the surface of the connecting pad 104. Therefore, the adhesive unit 5 improves the strength of connection between the metal structure and the connecting pad 104 and facilitates the deformation of the metal structure within the adhesive unit 5.

In an embodiment, the adhesive unit 5 includes insulating material and conductive particles. The first and second electrode pads 120, 121 can be metal and include multiple layers. In an embodiment, the metal includes lead, tin, indium, gold or alloy thereof. In an embodiment, the outermost layer of the first and second electrode pads 120, 121 includes lead, tin, indium, gold or alloy thereof. The conductive particles can be aggregated onto the connecting pads 104 and the first and second electrode pads 120, 121 via heat and/or force. Then, the conductive particles within the adhesive unit 5 are electrically connected to and directly connected to the first and second electrode pads 120, 121 and the connecting pads 104.

Referring to FIG. 1C, the protrusions 30 is formed on the intermediate layer 3, and the first light-emitting elements 101 located right beneath the protrusions 30 are pushed away from the intermediate layer 3. In the embodiment, one protrusion 30 pushes one first light-emitting element 101 arranged right beneath the protrusion 30 to the adhesive unit 5. The first light-emitting element 101 is detached from the intermediate layer 3 before being in contact with the adhesive units 5 on the second substrate 202. In other words, the first light-emitting elements 101 do not contact with the intermediate layer 3 during moving from the first substrate 201 to the second substrate 202. Besides, the moving distance of the first light-emitting element 101 after being detached from the intermediate layer 3 is equal to or less than the distance between the first substrate 201 and the second substrate 202 minus the height of the first light-emitting element 101 and the height of the connecting pads 104. In another embodiment, the intermediate layer 3 has a bubble layer (not shown) and an adhesive structure (not shown). The bubble layer is formed between the first substrate 201 and the adhesive structure. The adhesive structure is connected to the first light-emitting element 101. One or more blisters (not shown) are generated from the bubble layer by heating the bubble layer, so the bubble layer (not shown) and/or the adhesive structure are/is bulged to form the protrusions 30. As described above, the first light-emitting element 101 pushed to the second substrate 202 can be fixed on the second substrate 202 through the adhesive unit 5. In another embodiment, one or more protrusions 30 can be formed to push one or more first light-emitting elements 101, and related descriptions can be referred to FIGS. 5A~5G and related paragraphs. Referring to FIG. 1C, two first light-emitting elements 101 pushed from the first substrate 201 to the second substrate 202 are spaced from each other by three first light-emitting elements 101 while being arranged on the first substrate 201. The two first light-emitting elements 101 pushed from the first substrate 201 to the second substrate 202 can be spaced from each other by four or more first light-emitting elements 101 or by two or less first light-emitting elements 101. So, the distance between two neighboring first light-emitting elements 101 on the second substrate 202 can be decided by the number of the first light-emitting elements 101 between two first light-emitting elements 101 to be transferred while being arranged on the first substrate 201.

The protrusions 30 are generated by applying laser to the bubble layer. In an embodiment, the laser has a wavelength between 260 nm and 380 nm. For example, the wavelength can be 266 nm, 355 nm, or 375 nm. In an embodiment, the bubble layer is heated to form gas accumulated into blisters. The blister layer and/or the adhesive structure are bulged to form protrusions. The gas in the blisters does not leak out of the intermediate layer 3. In another embodiment, the first substrate 201 has a transmittance over 90% or a reflectance less than 10% with respect to the laser, the laser can pass through the first substrate 201. In an embodiment, the bubble layer includes polyimide.

FIG. 1D shows a schematic view of a light-emitting device in accordance with one embodiment of the present disclosure. The light-emitting device 1000 in FIG. 1D has a first light-emitting element 101, a second substrate 202, and an adhesive unit 5. The first light-emitting element 101 is fixed on the second substrate 202 and has the first and second electrode pads 120, 121, and the second substrate 202 has connecting pads 104. The adhesive unit 5 contains conductive particles 501, and some of the conductive particles 501 may be aggregated to form the conductive pillar 502 for electrically connecting the first light-emitting element 101 and the connecting pads 104, while the rest of the conductive particles 501 are dispersed within adhesive unit 5. In an embodiment, the pillar 502 has an upper portion 5012 close to the first light-emitting element 101, a lower portion 5010 close to the second substrate 202, and a neck portion 5011 arranged between the upper portion 5012 and the lower portion 5010. The width of the neck portion 5011 is less than the width of the upper portion 5012 or less than the width of the lower portion 5010. Some conductive particles 501 are dispersed within the insulating material, but not aggregated on the first and second electrode pads 120, 121 or on the connecting pad 104. The deformation of the adhesive unit 5 can be performed by heating and/or pressing. In an embodiment, the adhesive unit 5 covers at least a part of the side surface 1012. When the first light-emitting element 101 is detached from the intermediate layer 3, there may be residuals remaining on the first light-emitting element 101. In an embodiment, the second substrate 202 includes conductive wires (not shown), active electronic elements (not shown) and/or passive electronic elements (not shown) arranged on the second lower surface 2021 and/or the second upper surface 2020 to control one or multiple first light-emitting elements 101. The conductive wires can be metal wires, and the material of the metal wire can be copper, aluminum, or gold. The active electronic element can be a control chip or a transistor. The passive electronic element can be a resistor or a capacitor.

Figure 2A:
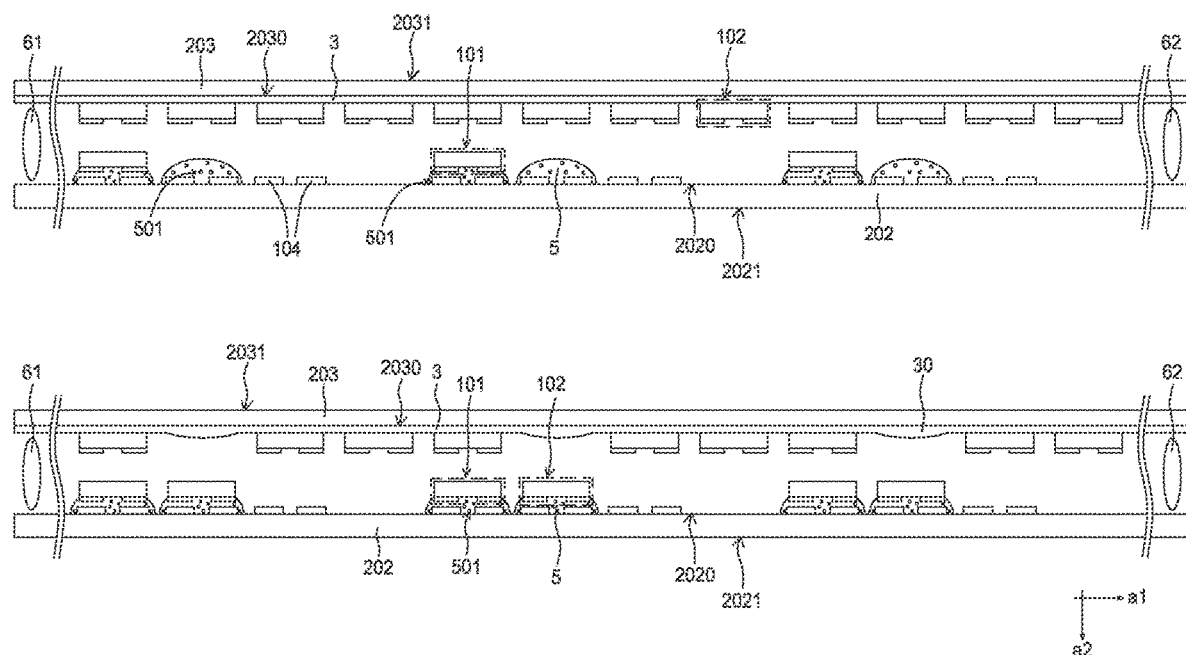
FIGS. 2A~2C show schematic views of manufacturing a light-emitting device in accordance with one embodiment of the present disclosure.
Figure 2B:
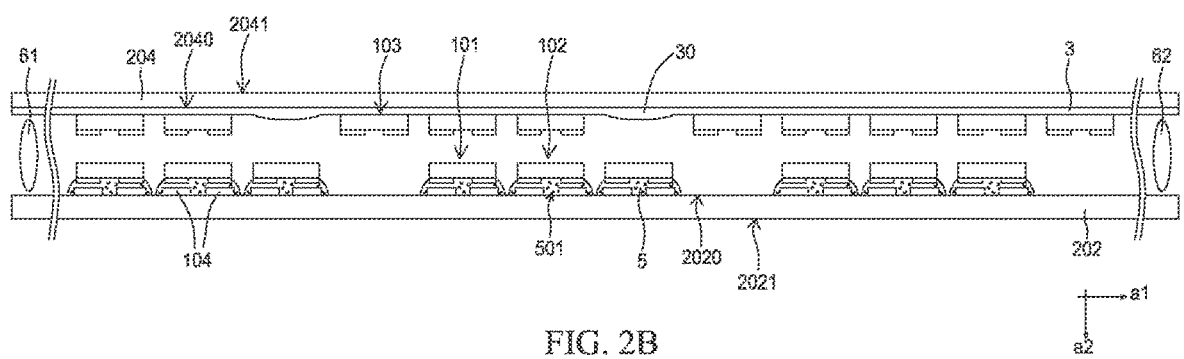
Figure 2C:
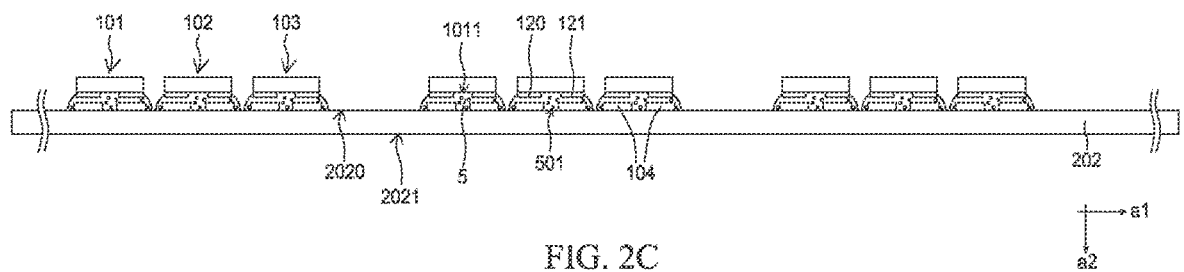

FIGS. 2A~2C show schematic views of manufacturing a light-emitting device in accordance with one embodiment of the present disclosure. In FIG. 2A, the second light-emitting elements 102 on the third substrate 203 being pushed to the second substrate 202 while the first light-emitting elements 101 are connected to the second substrate 202 through the adhesive units 5. As shown in the upper part of FIG. 2A, a second substrate 202 and the first light-emitting elements 101, adhesive units 5, and connecting pads 104 arranged on the second substrate 202 are provided, the third substrate 203 and the intermediate layer 3 and the second light-emitting elements 102 arranged on the third substrate 203 are provided, and the spacers 61, 62 between the second substrate 202 and the third substrate 203 are provided. As shown in the lower part of FIG. 2A, the second light-emitting elements 102 on the second substrate 203 are transferred to the second substrate 202. In other words, after arranging the first light emitting elements 101 on the second substrate 202 as shown in FIGS. 1A~1C, a third substrate 203 with second light-emitting elements 102 arranged thereon is provided, and all or part of the second light-emitting elements 102 are transferred to the area of the second substrate 202 not occupied by the first light-emitting elements 101. The third substrate 203 has a third lower surface 2030 and a third upper surface 2031, and the second light-emitting elements 102 are arranged on the third lower surface 2030 through the intermediate layer 3. To be more specific, the intermediate layer 3 as discussed above is formed on the third lower surface 2030 of the third substrate 203. The protrusions 30 are formed from the intermediate layer 3 to push the second light-emitting elements 102 arranged right beneath the protrusions 30 to be directly contacted with the adhesive units 5. The intermediate layer 3 may continuously or intermittently cover the third lower surface 2030 of the third substrate 203. For example, the intermediate layer 3 covers almost or all of the area of the third lower surface 2030, or covers only the area of the third lower surface 2030 corresponding to the second light-emitting element 102. The spacers 61, 62 are arranged between the second substrate 202 and the third substrate 203 to avoid direct contact between the second light-emitting element 102 and the first light-emitting element 101, between the second light-emitting element 102 and the connecting pads 104, or between the second light-emitting element 102 and the adhesive unit 5 before the process of transferring. The arrangements of the spacers 61, 62 on the second substrate 202 can be referred to FIGS. 6A~6C and related paragraphs. In an embodiment, the distance between the second substrate 202 and the third substrate 203 is larger than the twice of the height of first light-emitting element 101 or larger than twice of the height of the second light-emitting element 102. The procedure of pushing the second light-emitting elements 102 to the adhesive units 5 is similar with that of pushing the first light-emitting elements 101 to the adhesive units 5, and the related descriptions can be referred to previous paragraphs. During pushing the second light-emitting elements 102, some of the second light-emitting elements 102 on the third substrate 203 are overlapped with the first light-emitting elements 101 transferred to the second substrate 202. The second light-emitting element 102 (i.e, the second light-emitting elements not transferred) which is overlapped with the first light-emitting element 101 is not transferred to the second substrate 202. The second light-emitting element 102 not transferred can be wholly or partially overlapped with the first light-emitting element 101. Although the first light-emitting elements 101 and some of the second light-emitting elements 102 are overlapped with each other, the overlapped first light-emitting element 101 and the second light-emitting element 102 are not directly contacted with each other because the distance between the second substrate 202 and the third substrate 203 is designed to be larger than the sum of the height of the overlapped first light-emitting element 101 and the height of the second light-emitting element 102 as shown in FIG. 2A. The second light-emitting elements 102 are pushed to the second substrate 202 to be bonded to the adhesive units 5 on the second substrate 202 by the protrusions 30. The adhesive units 5 are formed on the second substrate 202 before the second light-emitting elements 102 are pushed to the second substrate 202. Alternatively, the adhesive units 5 are formed on the second substrate 202 before connecting the first light-emitting elements 101 to the second substrate 202. The spacers 61, 62 are arranged between the second substrate 202 and the third substrate 203 to avoid the second light-emitting element 102 from directly contacting with the first light-emitting element 101, the connecting pad 104 or the adhesive unit 5.

As shown in FIG. 2A, the second light-emitting elements 102 are pushed to the second substrate 202 and to be separated from the third substrate 203. The space between the third substrate 203 and the second substrate 202 can be controlled to avoid direct contact between the first light-emitting element 101 and the second light-emitting element 102. Therefore, the second light-emitting element 102 which is overlapped with the first light-emitting element 101 is not directly contacted with the first light-emitting element 101 and can be kept at the same position without being removed in advance during pushing the second light-emitting elements 102 to the connecting pads 104. Referring to FIG. 2A, a laser is applied to the intermediate layer 3 to form the protrusions. In an embodiment, the third substrate 203 has a transmittance over 90% or a reflectance less than 10% with respect to the laser, the laser can pass through the third substrate 203. The descriptions about laser can be referred previous paragraphs.

FIG. 2B shows the schematic view of the third light-emitting elements 103 on the fourth substrate 204 being pushed to the connecting pads 104 on the second substrate 202 to form the light-emitting device 2000 in FIG. 2C while the first light-emitting elements 101 and the second light-emitting elements 102 are connected to the second substrate 202 through the adhesive units 5. The fourth substrate 204 has a fourth lower surface 2040 and a fourth upper surface 2041, and the third light-emitting elements 103 are arranged on the fourth lower surface 2040 through the intermediate layer 3. In other words, FIG. 2B shows the situation of transferring the third light-emitting elements 103 to the area of the second substrate 202 not occupied by the first light-emitting elements 101 or the second light-emitting elements 102 while the first light-emitting elements 101 and the second light-emitting elements 102 are arranged on the second substrate 202. The intermediate layer 3 is arranged on the fourth lower surface 2040 of the fourth substrate 204, and multiple protrusions 30 are formed to push the third light-emitting elements 103 outward from the intermediate layer 3 to the adhesive units 5. The third light-emitting elements 103 are further fixed on the adhesive units 5 by heating the adhesive units 5 and/or pressing the third light-emitting elements 103 after connecting the third light-emitting elements 103 and the adhesive units 5. The spacers 61, 62 are arranged between the second substrate 202 and the fourth substrate 204 to avoid direct contact between the third light-emitting element 103 and the first and second light-emitting elements 101, 102, direct contact between the third light-emitting element 103 and the connecting pads 104, and direct contact between the third light-emitting element 103 and the adhesive unit 5 before finishing the process of transferring the third light-emitting elements 103. The procedure of pushing the third light-emitting elements 103 to the adhesive units 5 is similar with that of pushing the first light-emitting elements 101 to the adhesive units 5, and the related descriptions can be referred to previous paragraphs. The intermediate layer 3 may continuously or intermittently cover the fourth lower surface 2040 of the fourth substrate 204. For example, the intermediate layer 3 covers almost or all of the area of the fourth lower surface 2040, or covers only the area of the fourth lower surface 2040 corresponding to the third light-emitting element 103. As shown in the lateral view of FIG. 2B, some third light-emitting elements 103 arranged on the fourth substrate 204 are overlapped with the first light-emitting elements 101 on the second substrate 202, and some third light-emitting elements 103 arranged on the fourth substrate 204 are overlapped with the second light-emitting elements 102 on the second substrate 202. The third light-emitting elements 103 overlapped with the first light-emitting elements 101, 102 are not removed during connecting the third light-emitting elements 103 with the connecting pads 104. The space between the fourth substrate 204 and the second substrate 202 is large enough to avoid direct contact between the first light-emitting elements 101, 102 and the third light-emitting elements 103. In other words, the distance between the fourth substrate 204 and the second substrate 202 is larger than the sum of the height of the first light-emitting element 101 and the height of the third light-emitting element 103, and is larger than the sum of the height of the second light-emitting element 102 and the height of the third light-emitting element 103. The overlapped first light-emitting element 101 (or the second light-emitting element 102) and the third light-emitting element 103 are not directly contacted with each other. As shown in FIG. 2B, the adhesive units 5 are formed on the second substrate 202 before pushing the third light-emitting elements 103 to the second substrate 202. Furthermore, the adhesive units 5 can be formed on the second substrate 202 before connecting the first light-emitting elements 101 with the second substrate 202 or before connecting the second light-emitting elements 102 with the second substrate 202. Referring to FIG. 2B, a laser is applied to form the protrusions. In an embodiment, the fourth substrate 204 has a transmittance over 90% or a reflectance less than 10% with respect to the laser, the laser can pass through the fourth substrate 204. The descriptions about laser can be referred previous paragraphs.

Referring to FIG. 2C, the light-emitting device 2000 has first light-emitting elements 101, second light-emitting elements 102, third light-emitting elements 103, the second substrate 202, the adhesive units 5, and connecting pads 104. In an embodiment, the adhesive units 5 arranged between the first, second and third light-emitting elements 101, 102, 103 and the second substrate 202 are directly connected to the bottom surface of the light-emitting elements, for example, the bottom surface 1011. In an embodiment, conductive wires, active electronic elements and passive electronic elements are arranged on the second lower surface 2021 and/or the second upper surface 2020 of the second substrate 202 to be electrically connected to the connecting pads 104 to control the first light-emitting elements 101, 102, 103. Descriptions about the conductive wires, active electronic elements and passive electronic elements can be referred to previous paragraphs.

In an embodiment, the first light-emitting element 101, the second light-emitting element 102, and the third light-emitting element 103 emit lights of different peak wavelengths. For example, the first light-emitting element 101 emits a red light with a peak wavelength of 610~650 nm, the second light-emitting element 102 emits a green light with a peak wavelength of 495~570 nm, and the third light-emitting element 103 emits a blue light with a peak wavelength of 450~495 nm. In an embodiment, the light-emitting device 2000 is a display having the first light-emitting elements 101, the second light-emitting elements 102, and the third light-emitting elements 103 as pixels.

In an embodiment, the light-emitting device 2000 emits a light of a single color. The first light-emitting elements 101, the second light-emitting elements 102, and the third light-emitting elements 103 emit lights of same or similar peak wavelengths. For example, the first light-emitting elements 101, the second light-emitting elements 102, and the third light-emitting elements 103 emit blue lights having a peak wavelength between 420 nm and 495 nm. In an embodiment, the light-emitting device 2000 is a light source for daily lighting application, and emits a light having a color temperature between 2200K and 6500K (for example, 2200K, 2400K, 2700K, 3000K, 5700K, 6500K). In an embodiment, the light-emitting device 2000 is a back light source of a LCD display, and emits a light having a color temperature between 10000K and 20000K, and has a color point coordinate (x,y) in the CIE 1931 chromaticity diagram, $0.27 \times 0.285$; $0.23 \leq y \leq 0.26$. In order to provide a light of a color, the first light-emitting elements 101, the second light-emitting elements 102, and the third light-emitting elements 103 can be commonly covered by the same wavelength conversion structure, or the first light-emitting elements 101, the second light-emitting elements 102, and the third light-emitting elements 103 can be respectively covered by different wavelength conversion structures to convert light from the first light-emitting elements 101, the second light-emitting elements 102, and the third light-emitting elements 103. The wavelength conversion structure includes material to convert the light, such as the phosphor, quantum dots, or dyes.

Figure 3A:
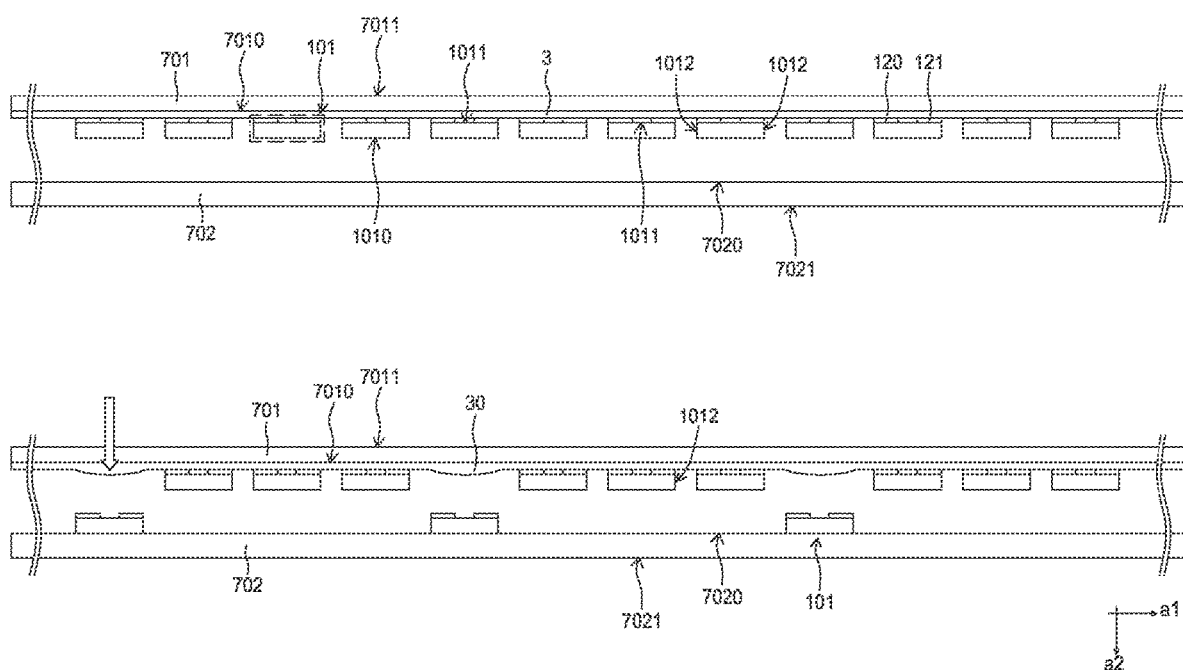
FIGS. 3A~3C show schematic views of manufacturing a light-emitting device in accordance with one embodiment of the present disclosure.
Figure 3B:
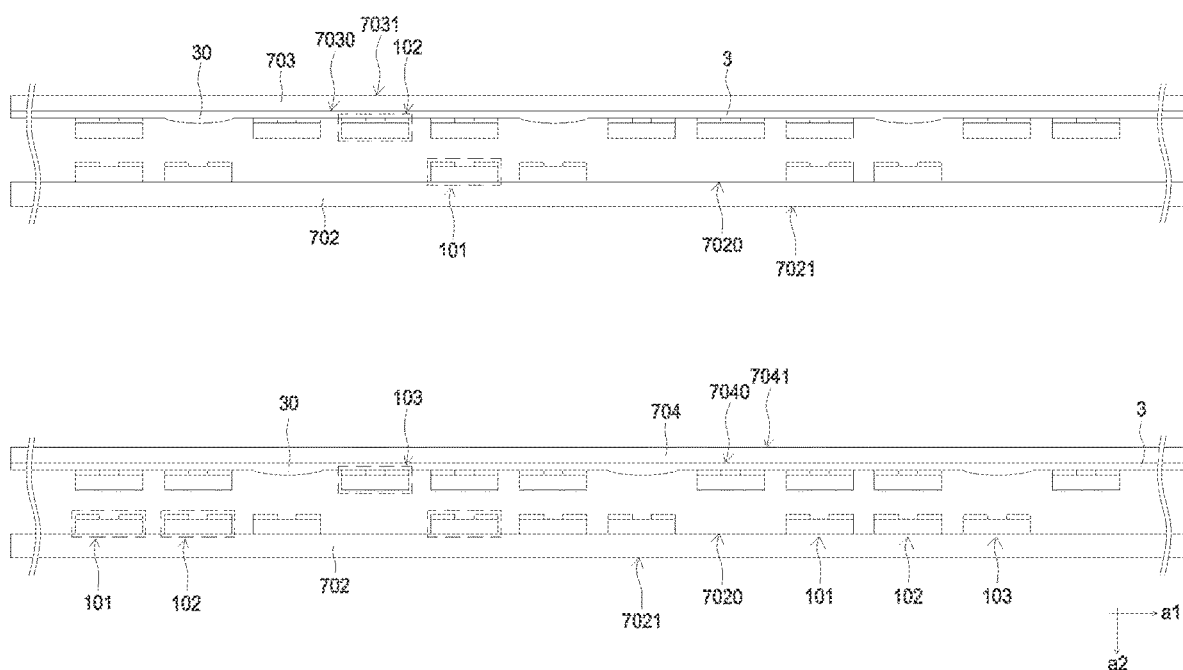
Figure 3C:
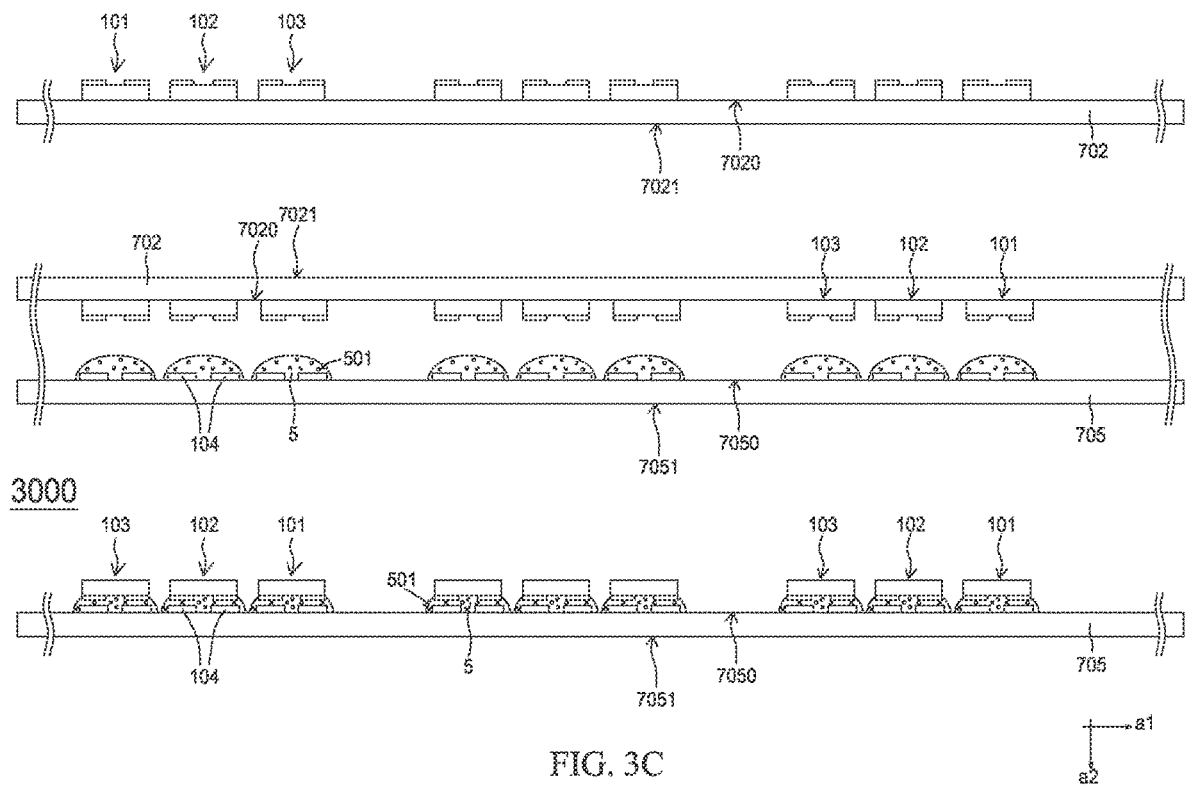

FIGS. 3A~3C show schematic views of manufacturing a light-emitting device in accordance with one embodiment of the present disclosure. As shown in FIG. 3A, a sixth substrate 702 and a fifth substrate 701 having an intermediate layer 3 formed thereon are provided, and the first light-emitting elements 101 are connected to the fifth substrate 701 through the intermediate layer 3. Then, the first light-emitting elements 101 are pushed to the sixth substrate 702 by the protrusions 30. Descriptions related to the intermediate layer, the light-emitting element, and the protrusion can be referred to previous paragraphs. The first light-emitting element 101 has a bottom surface 1010 close to the sixth substrate 702 and a top surface 1011 close to the fifth substrate 701. The first light-emitting elements 101 are connected to the intermediate layer 3 through the first and second electrode pads 120, 121. The fifth substrate 701 has a fifth lower surface 7010 and a fifth upper surface 7011, and the first light-emitting elements 101 are arranged on the fifth lower surface 7010 through the intermediate layer 3. The intermediate layer 3 may continuously or intermittently cover the fifth lower surface 7010 of the fifth substrate 701. For example, the intermediate layer 3 covers almost or all of the area of the fifth lower surface 7010, or covers only the area of the fifth lower surface 7010 corresponding to the first light-emitting element 101. The first light-emitting elements 101 arranged right beneath the protrusions 30 are pushed to the sixth substrate 702 by the protrusions 30. The bottom surface 1010 is directly connected to the sixth substrate 702.

The sixth substrate 702 can be adhesive, so the first light-emitting elements 101 can be fixed on predetermined positions of the sixth substrate 702. For example, the sixth substrate 702 is a blue tape or an UV release tape. Referring to FIG. 3A, a laser is applied to the intermediate layer 3 to form the protrusions. In an embodiment, the fifth substrate 701 has a transmittance over 90% or a reflectance less than 10% with respect to the laser, the laser can pass through the fifth substrate 701. The descriptions about laser can be referred to previous paragraphs. In embodiment, a spacer is arranged between the fifth substrate 701 and the sixth substrate 702 to prevent direct contact between the first light-emitting element 101 and the sixth substrate 702 during transferring the first light-emitting elements 101.

FIG. 3B shows the second light-emitting elements 102 on the seventh substrate 703 and the third light-emitting elements 103 on the eighth substrate 704, and the step of transferring the second light-emitting elements 102 and the third light-emitting elements 103 to the sixth substrate 702 by the protrusions 30. To be more specific, the second and third light-emitting elements 102, 103 are transferred to the sixth substrate 702 while the first light-emitting elements 101 are arranged on the sixth substrate 702. Referring to the upper part of FIG. 3B, a sixth substrate 702 and the first light-emitting elements 101 arranged thereon are provided, and a seventh substrate 703 and multiple second light-emitting elements 102 and an intermediate layer 3 arranged thereon are provided. The seventh substrate 703 has a seventh lower surface 7030 and a seventh upper surface 7031, an intermediate layer 3 is formed on the seventh lower surface 7030 of the seventh substrate 703, and the second light-emitting elements 102 are arranged on the seventh lower surface 7030 through the intermediate layer 3. The protrusions 30 push the second light-emitting elements 102 to the sixth substrate 702. The intermediate layer 3 may continuously or intermittently cover the seventh lower surface 7030 of the seventh substrate 703. For example, the intermediate layer 3 covers almost or all of the area of the seventh lower surface 7030, or covers only the area of the seventh lower surface 7030 corresponding to the second light-emitting element 102. Referring to the lower part of FIG. 3B, a sixth substrate 702 and the first and second light-emitting elements 101, 102 arranged thereon are provided, and an eighth substrate 704 and multiple third light-emitting elements 103 and an intermediate layer 3 arranged thereon are provided. The eighth substrate 704 has an eighth lower surface 7040 and an eighth upper surface 7041, an intermediate layer 3 is formed on the eighth lower surface 7040 of the eighth substrate 704, and the third light-emitting elements 103 are arranged on the eighth lower surface 7040 through the intermediate layer 3. The protrusions 30 push the third light-emitting elements 103 to the sixth substrate 702. The intermediate layer 3 may continuously or intermittently cover the eighth lower surface 7040 of the eighth substrate 704. For example, the intermediate layer 3 covers almost or all of the area of the eighth lower surface 7040, or covers only the area of the eighth lower surface 7040 corresponding to the third light-emitting element 103. The distance between the sixth substrate 702 and the seventh substrate 703 is larger than the sum of the height of the first light-emitting element 101 and the height of the second light-emitting element 102. The distance between the sixth substrate 702 and the eighth substrate 704 is larger than the sum of the height of the first light-emitting element 101 and the height of the third light-emitting element 103 or the sum of the height of the second light-emitting element 102 and the height of the third light-emitting element 103. Referring to FIG. 3B, a laser is applied to the intermediate layer 3 on the seventh substrate 703 and another laser is applied on the intermediate layer 3 on the eighth substrate 704 to form the protrusions 30. In an embodiment, each of the seventh substrate 703 and the eighth substrate 704 has a transmittance over 90% or a reflectance less than 10% with respect to the laser so the laser can pass through the seventh substrate 703 and the eighth substrate 704 respectively. The descriptions about laser can be referred to previous paragraphs.

FIG. 3C shows the step of connecting the first light-emitting elements 101, the second light-emitting elements 102, and third light-emitting elements 103 on the sixth substrate 702 to the ninth substrate 705. As shown in the upper part of FIG. 3C, the first light-emitting elements 101, the second light-emitting elements 102, and the third light-emitting elements 103 are arranged on the sixth substrate 702. Next, as shown in the middle part of FIG. 3C, the sixth substrate 702 is flipped upside down, and a ninth substrate 705 having the connecting pads 104 and the adhesive units 5 is placed under the first light-emitting elements 101, the second light-emitting elements 102, and the third light-emitting elements 103. After the sixth substrate 702 is flipped upside down, it moves towards the ninth substrate 705. Alternatively, after the sixth substrate 702 is flipped upside down, it is fixed and the ninth substrate 705 is moved towards the sixth substrate 702. Or the sixth substrate 702 and the ninth substrate 705 move towards each other. Either way, the first light-emitting elements 101, the second light-emitting elements 102, and third light-emitting elements 103 are moved toward the ninth substrate 705 before being connected to the adhesive units 5. Then, the first light-emitting elements 101, the second light-emitting elements 102, and third light-emitting elements 103 are fixed to the adhesive units 5 by heating the adhesive units 5 and/or pressing the sixth substrate 702. Then, as shown in the lower part of FIG. 3C, the sixth substrate 702 is removed to form the light-emitting device 3000. The light-emitting device 3000 has the first light-emitting elements 101, the second light-emitting elements 102, the third light-emitting elements 103, the ninth substrate 705, the adhesive units 5 and connecting pads 104. The light-emitting device 3000 can be a display or a backlight module. The description about the adhesive unit can be referred to previous paragraphs, and is omitted for brevity.

Figure 3D:
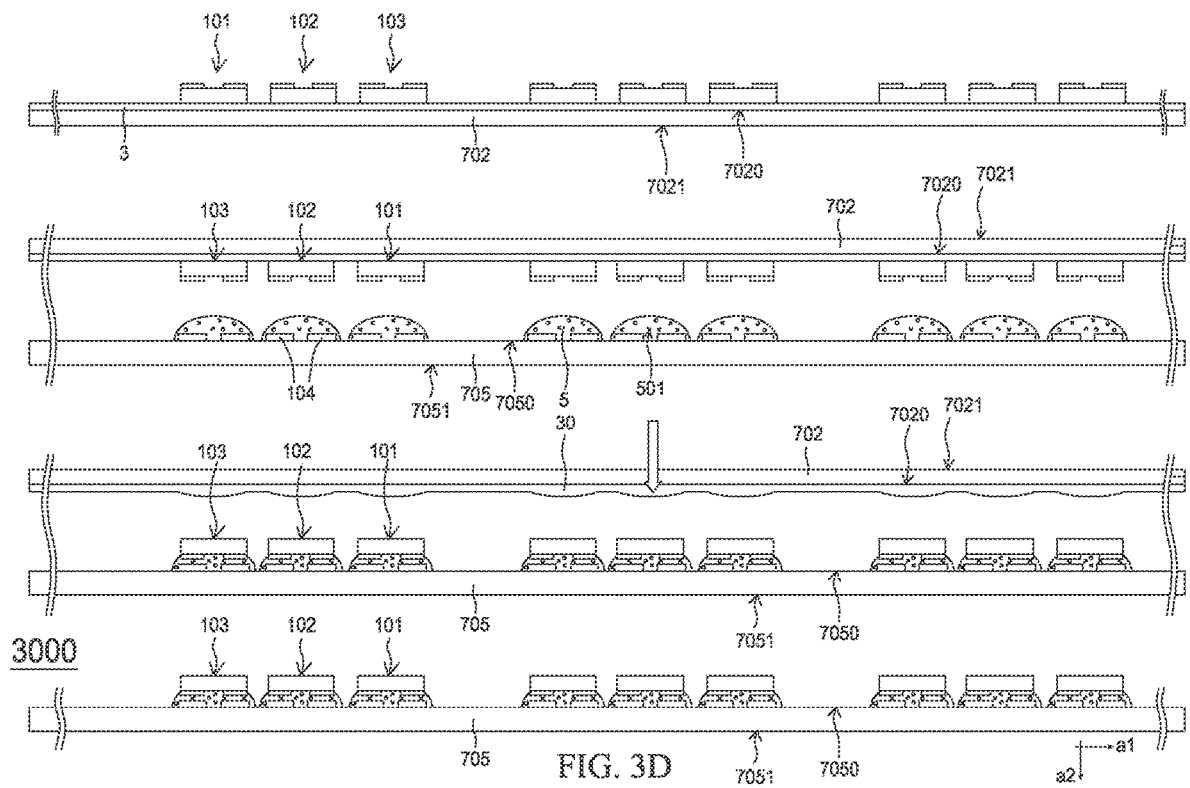
FIG. 3D shows a schematic view of manufacturing a light-emitting device in accordance with one embodiment of the present disclosure.

Except the manufacturing process disclosed in FIGS. 3A~3C, the light-emitting elements can be moved to a substrate having an intermediate layer arranged thereon before being connected to a substrate having adhesive units and connecting pads arranged thereon to form the light-emitting device 3000. To be more specific, referring to FIG. 3D, the first light-emitting elements 101, the second light-emitting elements 102, and the third light-emitting elements 103 are transferred to a sixth substrate 702 having an intermediate layer 3 formed thereon. The sixth substrate 702 has a sixth lower surface 7021 and a sixth upper surface 7020. The first light-emitting elements 101, the second light-emitting elements 102, and the third light-emitting elements 103 are arranged on the sixth upper surface 7020 through the intermediate layer 3. Then, a ninth substrate 705 having connecting pads 104 and adhesive units 5 arranged thereon is provided. The ninth substrate 705 has a ninth lower surface 7051 and a ninth upper surface 7050. The connecting pads 104 and adhesive units 5 are arranged on the ninth upper surface 7050. The sixth substrate 702 is turned over, and the first light-emitting elements 101, the second light-emitting elements 102, and the third light-emitting elements 103 are pushed toward the ninth substrate 705. Multiple protrusions 30 are formed on the intermediate layer 3. The first light-emitting elements 101, the second light-emitting elements 102, and the third light-emitting elements 103 are pushed to the ninth substrate 705 by the protrusions 30, and the first light-emitting elements 101, the second light-emitting elements 102, and the third light-emitting elements 103 are fixed on the adhesive units 5 by heating the adhesive units 5 and/or pressing the first light-emitting elements 101, the second light-emitting elements 102, and the third light-emitting elements 103. The sixth substrate 702 is then removed to form the light-emitting device 3000. Referring to FIG. 3D, a laser is applied to the intermediate layer 3 to form the protrusions 30. In an embodiment, the sixth substrate 702 has a transmittance over 90% or a reflectance less than 10% with respect to the laser so the laser can pass through the sixth substrate 702. The descriptions about laser can be referred previous paragraphs. In embodiment, conductive wires, active electronic elements and/or passive electronic elements are arranged on the ninth lower surface 7051 and/or the ninth upper surface 7050 of the ninth substrate 705. Descriptions about the conductive wires, active electronic elements and passive electronic elements can be referred to previous paragraphs. In an embodiment, referring to the step shown in FIGS. 3C and 3D, a spacer is arranged between the sixth substrate 702 and the ninth substrate 705. The spacer is provided to keep the distance between the sixth substrate 702 and the ninth substrate 705, so as to prevent the first light-emitting elements 101, the second light-emitting elements 102, and the third light-emitting elements 103 from directly contacting the adhesive units 5 or the ninth substrate 705 before being detached from the sixth substrate 702. Descriptions about the spacer can be referred to previous paragraphs.

Figure 4A:
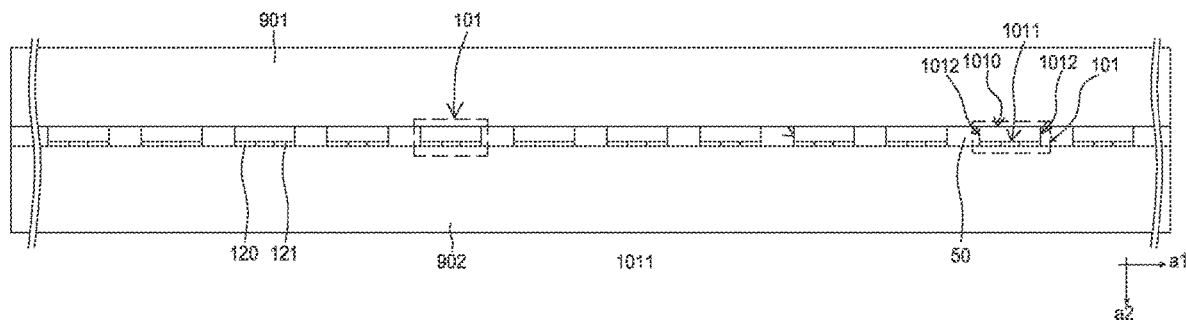
FIGS. 4A~4G show schematic views of manufacturing a light-emitting device in accordance with one embodiment of the present disclosure.

FIGS. 4A~4G show schematic views of manufacturing a light-emitting device in accordance with one embodiment of the present disclosure. As shown in FIG. 4A, a tenth substrate 901 carrying multiple first light-emitting elements 101 and an eleventh substrate 902 are provided. The tenth substrate 901 is connected to the eleventh substrate 902 through the adhesive structure 50. The first light-emitting element 101 is surrounded by the adhesive structure 50. Description about the first light-emitting element 101 can be referred to previous paragraphs. The adhesive structure 50 physically fixes the tenth substrate 901 to the eleventh substrate 902. In an embodiment, the adhesive structure 50 includes an insulating material such as silicone or epoxy. The first light-emitting element 101 has a top surface 1010 facing the tenth substrate 901, a bottom surface 1011 facing the eleventh substrate 902, and a side surface 1012 connecting the top surface 1010 and the bottom surface 1011. In an embodiment, the bottom surface 1011 is directly contacted with the adhesive structure 50. In an embodiment, the tenth substrate 901 is a substrate for growing epitaxy layers of the first light-emitting elements 101. In an embodiment, the tenth substrate 901 has sapphire, silicon, germanium, or nitride. In an embodiment, the adhesive structure 50 is arranged between the first and second electrode pads 120, 121 and the eleventh substrate 902.

Figure 4B:
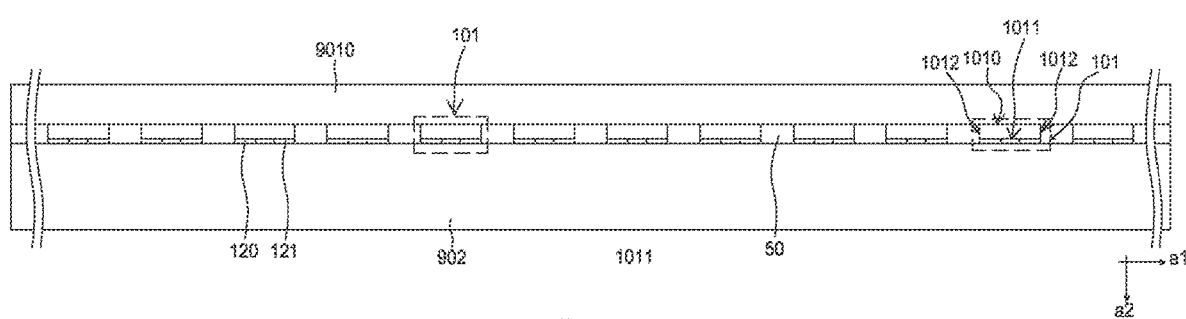

Referring to FIG. 4B, a part of the tenth substrate 901 is removed to form a thinned substrate 9010. The thinned substrate 9010 has a thickness less than that of the tenth substrate 901. In an embodiment, the thickness of the thinned substrate 9010 is between 10 µm~50 µm.

Figure 4C:
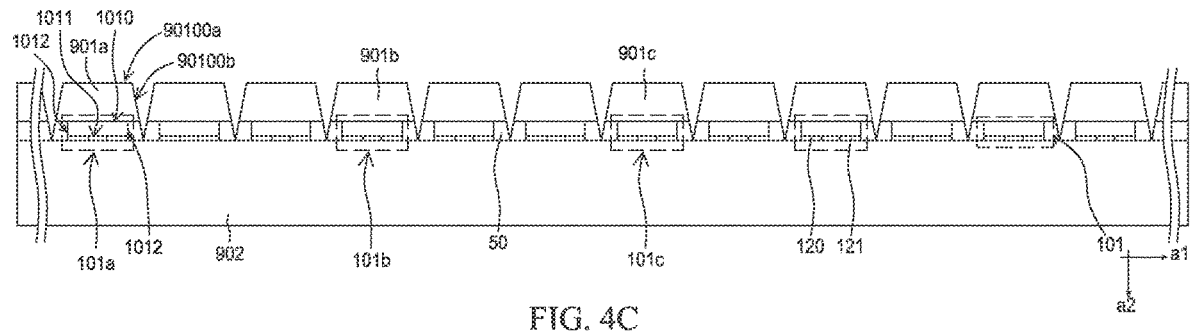

Referring to FIG. 4C, the thinned substrate 9010 is divided into several unit substrates 901a, 901b, 901c. The unit substrates 901a, 901b, 901c are connected to different first light-emitting elements 101 respectively. For example, the unit substrate 901a is connected to the first light-emitting element 101a, the unit substrate 901b is connected to the first light-emitting element 101b, and the unit substrate 901c is connected to the first light-emitting element 101c. The process of forming the unit substrates 901a, 901b, 901c can be performed by using a dicing blade or a laser having a wavelength between 260 nm and 380 nm. During forming multiple unit substrates 901a, 901b, 901c, the first light-emitting elements 101 and the eleventh substrate 902 are not damaged, but a portion of the adhesive structure 50 is removed. The unit substrate 901a, 901b, 901c has a width narrower than that of the thinned substrate 9010, and one unit substrate 901a, 901b, 901c corresponds to or covers only one first light-emitting element 101. In an embodiment, one unit substrate 901a, 901b, 901c corresponds to or covers two or more first light-emitting element 101.

Figure 4D:
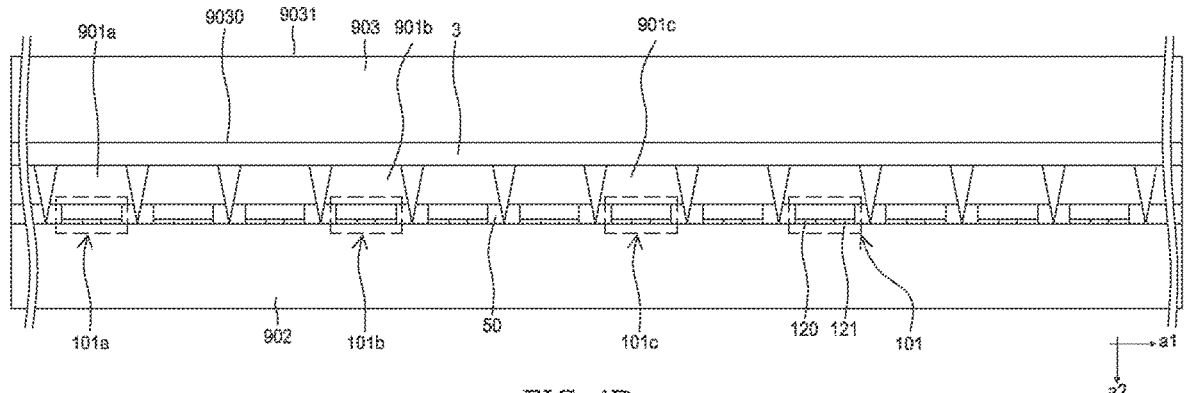

Referring to FIG. 4D, a twelfth substrate 903 covered by an intermediate layer 3 is provided. The twelfth substrate 903 has a twelfth lower surface 9030 and a twelfth upper surface 9031. The intermediate layer 3 is arranged on the twelfth lower surface 9030. The unit substrates 901a, 901b, 901c are connected to the twelfth substrate 903 through the intermediate layer 3. In another aspect, the first light-emitting element 101 and corresponding unit substrate 901a, 901b, 901c are connected to the twelfth substrate 903 through the intermediate layer 3.

Figure 4E:
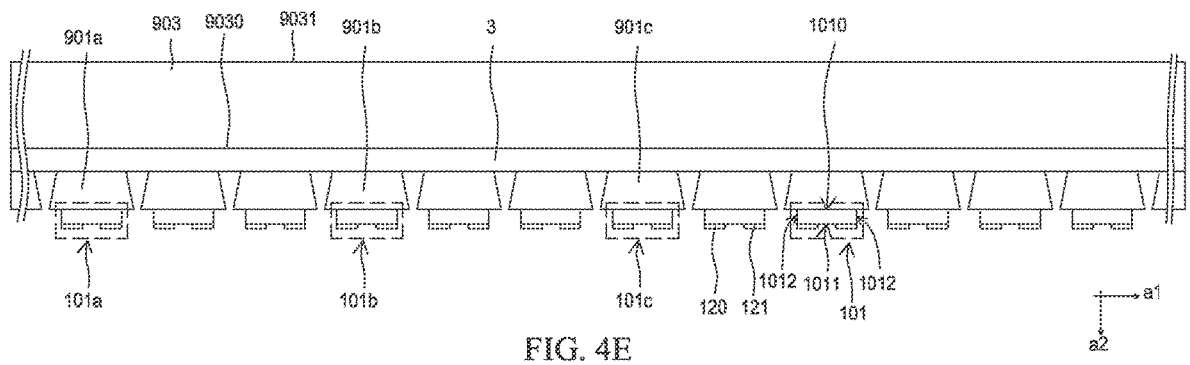

Referring to FIG. 4E, the eleventh substrate 902 is removed to expose the first light-emitting elements 101. The bottom surface 1011 and the first and second electrode pads 120, 121 of the first light-emitting elements 101 are exposed. All or a part of the adhesive structure 50 can be removed before or after removing the eleventh substrate 902. In an embodiment, a portion of the adhesive structure 50 is left on the first light-emitting element 101 and/or the unit substrates 901a, 901b, 901c after removing the eleventh substrate 902. In an embodiment, a portion of the adhesive structure 50 is left on the first and second electrode pads 120, 121 after removing the eleventh substrate 902.

Figure 4F:
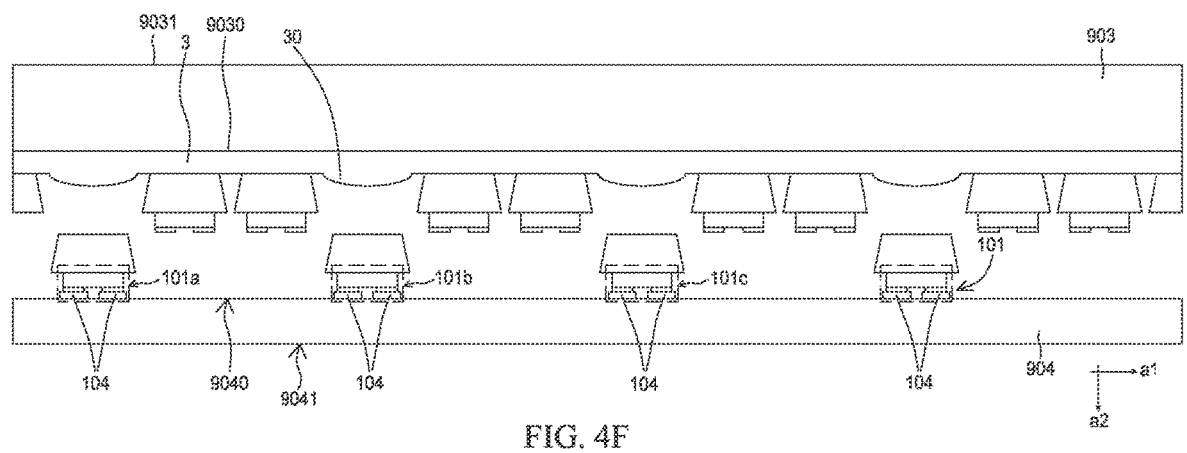

Referring to FIG. 4F, a thirteenth substrate 904 is arranged under the twelfth substrate 903. The thirteenth substrate 904 has a thirteenth lower surface 9041 and a thirteenth upper surface 9040. The connecting pads 104 are arranged on the thirteenth upper surface 9040. The connecting pads 104 are arranged on the thirteenth upper surface 9040, and a part of the thirteenth upper surface 9040 is exposed without being covered by the connecting pads 104. Then, the protrusions 30 are formed to push the first light-emitting elements 101 to the thirteenth substrate 904. For example, the first light-emitting elements 101a, 101b, 101c are pushed away from the twelfth substrate 903 by the protrusions 30, and the first light-emitting elements 101a, 101b, 101c are then fixed to the thirteenth substrate 904 to form a light-emitting device 4000 shown in FIG. 4G. Referring to FIG. 4F, a laser is applied to form the protrusions 30. In an embodiment, the twelfth substrate 903 has a transmittance over 90% or a reflectance less than 10% with respect to the laser so the laser can pass through the twelfth substrate 903. The descriptions about laser can be referred to previous paragraphs. In an embodiment, a spacer is arranged between the twelfth substrate 903 and the thirteenth substrate 904 to keep the first light-emitting elements 101 from directly contacting with the thirteenth substrate 904 before leaving the twelfth substrate 903. Description about the spacer can be referred to previous paragraphs and paragraphs corresponding to FIGS. 6A~6C, and is omitted for brevity.

Figure 4G:
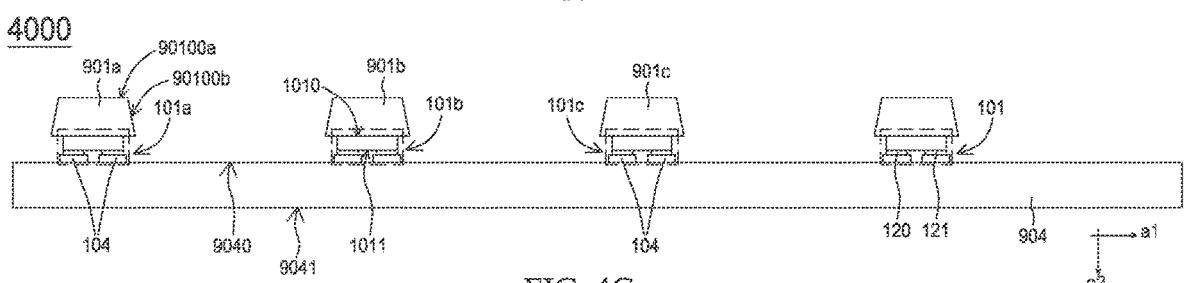

Referring to FIG. 4G, the light-emitting device 4000 has the first light-emitting elements 101 (for example, the first light-emitting elements 101a, 101b, 101c), the thirteenth substrate 904, the unit substrates 901a, 901b, 901c, and the connecting pads 104. The first light-emitting elements 101 are connected to the unit substrates 901a, 901b, 901c. For example, the first light-emitting element 101a is connected to the unit substrate 901a, the first light-emitting element 101b is connected to the unit substrate 901b, and the first light-emitting element 101c is connected to the unit substrate 901c. The unit substrate 901a has a top surface 90100a parallel to the thirteenth upper surface 9040 and an inclined surface 90100b not parallel to the thirteenth upper surface 9040. The light from the first light-emitting element 101 leaves the unit substrate 901a from the inclined surface 90100b to increase the luminous intensity and improve the uniformity of the light field provided by the light-emitting device 4000.

In an embodiment, conductive wires, active electronic elements and/or passive electronic elements are arranged on the thirteenth upper surface 9040 and/or on the thirteenth lower surface 9041. For example, referring to FIG. 4G, the first light-emitting elements 101a, 101b, 101c in the light-emitting device 4000 are electrically connected to the conductive wires (not shown) on the thirteenth upper surface 9040. The light-emitting device 4000 can receive power and control signals through the conductive wires (not shown) for transmitting the power and control signals to control the first light-emitting elements 101a, 101b, 101c together or separately. In an embodiment, the connecting pads 104 are arranged on the thirteenth upper surface 9040 with a predetermined distance, and the first light-emitting elements 101 are placed on the connecting pads 104 according to the predetermined distance. Descriptions about the conductive wires, active electronic elements and passive electronic elements can be referred to previous paragraphs.

In addition, one or more distance adjusting substrates and related process can be incorporated to the manufacturing process to change the distance between two neighboring first light-emitting elements 101 in the light-emitting device 4000. The distance adjusting substrate can be stretched in one dimensional direction or in two dimensional directions to change the distance between light-emitting elements arranged thereon. For example, a first distance adjusting substrate and related process is performed after the process shown in FIG. 4E. Referring to FIG. 4E, the first distance adjusting substrate is provided to be attached to the first light-emitting element 101 from the side opposite to the twelfth substrate 903. Next, the twelfth substrate 903 is removed and the first light-emitting elements 101 and corresponding unit substrates 901a, 901b, 901c on the twelfth substrate 903 are transferred to the first distance adjusting substrate, wherein the first light-emitting elements 101 are directly in contacted with the first distance adjusting substrate and the corresponding unit substrates 901a, 901b, 901c are exposed. After transferring the first light-emitting element 101 and corresponding unit substrates 901a, 901b, 901c to the first distance adjusting substrate, the first distance adjusting substrate is stretched to increase the distance between two first light-emitting elements 101. The first distance adjusting substrate can be stretched in one dimensional direction or in two dimensional directions so the distance between two first light-emitting elements 101 in one dimensional direction or in two dimensional directions can be increased. After stretching the first distance adjusting substrate, a second distance adjusting substrate is provided to transfer first light-emitting elements 101 by directly connecting the unit substrates 901a, 901b, 901c and the second distance adjusting substrate, and the first distance adjusting substrate is then removed. After transferring the first light-emitting elements 101 and corresponding unit substrates 901a, 901b, 901c to the second distance adjusting substrate, pushing the second distance adjusting substrate toward the thirteenth substrate 904 to connect the first light-emitting elements 101 and the thirteenth upper surface 9040 and removing the second distance adjusting substrate to form the light-emitting device 4000. The distance adjusting substrate can be a blue tape and has an area same as or different from that of the twelfth substrate 903. Moreover, in an embodiment, the substrate 201, 202, 203, 204, 701, 702, 703, 704, 705, 902, 903, 904 can be stretched in one dimensional direction or in two dimensional directions to change the distance in one dimensional direction or the distances in two dimensional directions between the light-emitting elements arranged thereon.

Referring to the process shown in FIGS. 3A~3C, a relative position adjusting substrate can be incorporated in the process in FIGS. 4A~4G to adjust the relative position of the first light-emitting elements 101 on the thirteenth substrate 904. For example, a relative position adjusting substrate is provided, and the first light-emitting elements 101 in FIG. 4E are connected to the relative position adjusting substrate. Next, the twelfth substrate 903 is removed to expose the unit substrates 901a, 901b, 901c. Then, the first light-emitting elements 101 and the unit substrates 901a, 901b, 901c are pushed to the thirteenth substrate 904. Therefore, the first light-emitting elements 101 are connected to the thirteenth substrate 904 through the unit substrates 901a, 901b, 901c. Then, wires are provided to connect the first and second electrode pads 120, 121 and the connecting pads 104 to form a light-emitting device. In an embodiment, the relative position adjusting substrate is a blue tape.

Figure 5A:
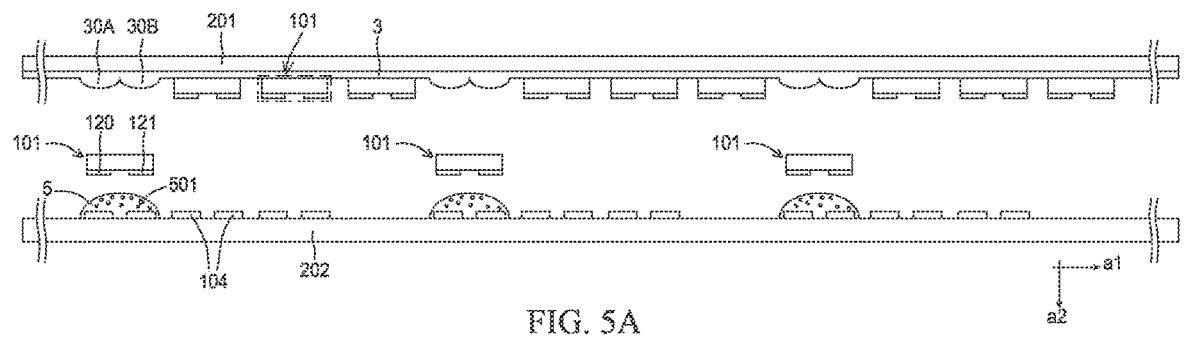
FIGS. 5A~5G show schematic views of protrusion and adhesive unit in accordance with one embodiment of the present disclosure.
Figure 5B:
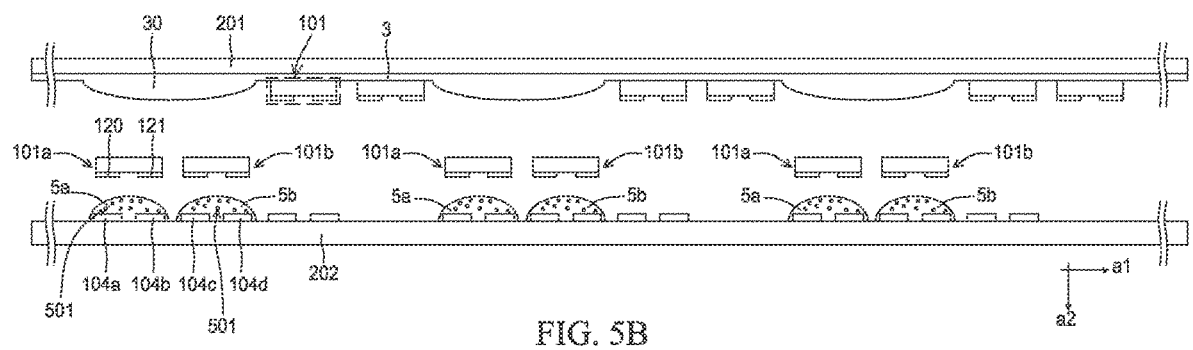
Figure 5C:
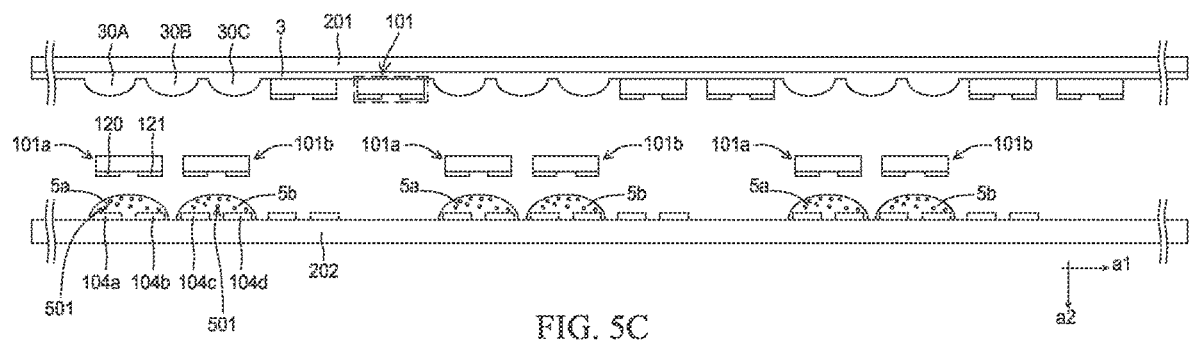
Figure 5D:
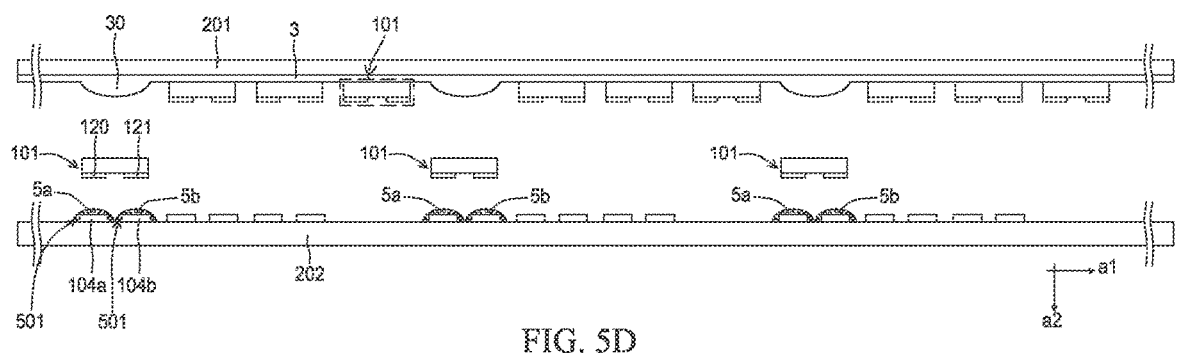
Figure 5E:
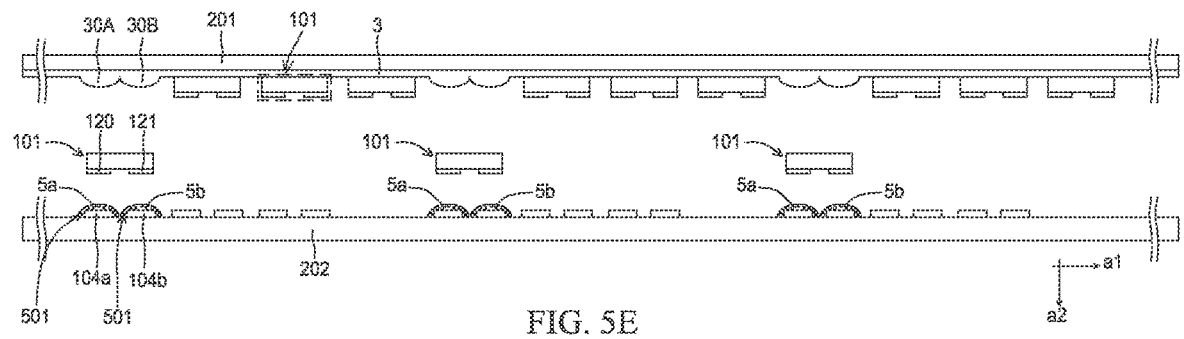
Figure 5F:
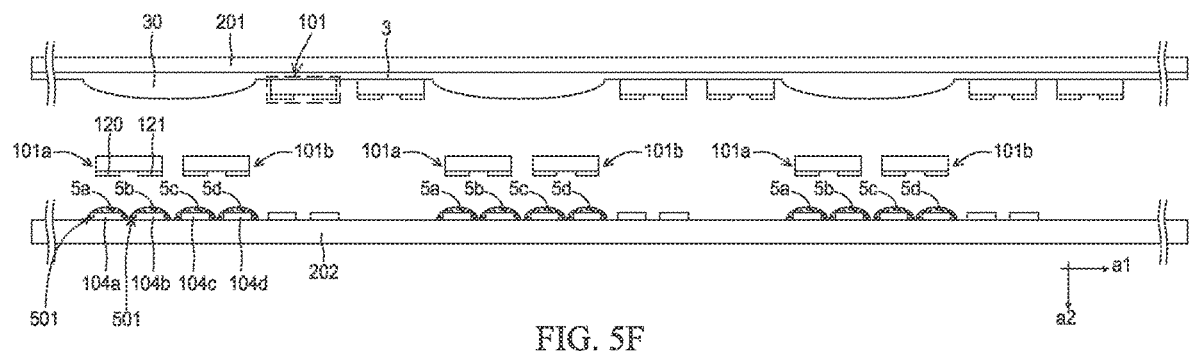
Figure 5G:
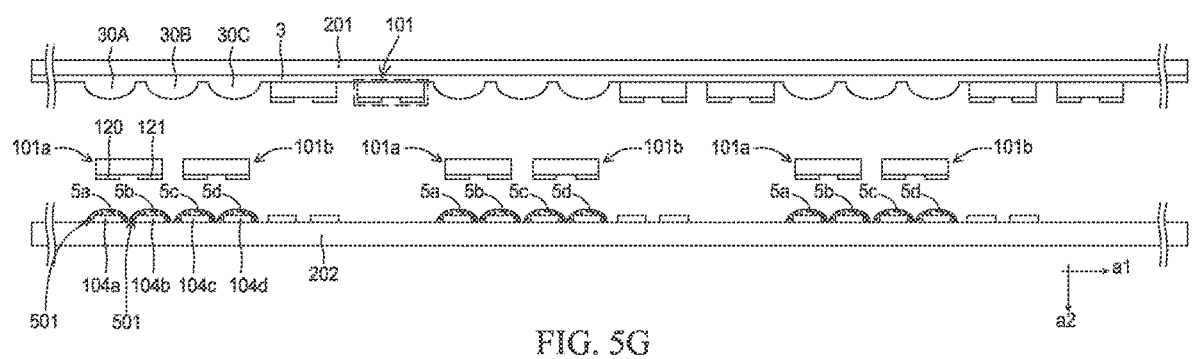

FIGS. 5A~5G show schematic views protrusion and adhesive unit in accordance with one embodiment of the present disclosure. Referring to FIG. 5A, two protrusions 30A, 30B push the first light-emitting element 101 away from the intermediate layer 3, causing the first light-emitting element 101 to fly to the adhesive unit 5. Referring to FIG. 5B, the protrusions 30 push the first light-emitting elements 101a, 101b away from the intermediate layer 3, causing the first light-emitting elements 101a, 101b to fly to the adhesive units 5a, 5b. Referring to FIG. 5C, the protrusions 30A, 30B, 30C push the first light-emitting elements 101a, 101b away from the intermediate layer 3, causing the first light-emitting elements 101a, 101b to fly to the adhesive units 5a, 5b. The first light-emitting element 101 pushed by the protrusion 30 can be connected to different adhesive units 5. Referring to FIG. 5D, the first light-emitting element 101 is pushed to the adhesive units 5a, 5b by the protrusion 30. The first electrode pad 120 of the first light-emitting element 101 is connected to the adhesive unit 5a covering the connecting pad 104a. The second electrode pad 121 of the first light-emitting element 101 is connected to the adhesive unit 5b covering the connecting pad 104b. Referring to FIG. 5E, the first light-emitting element 101 is pushed to the adhesive units 5a, 5b by the protrusions 30A, 30B. Referring to FIG. 5F, the first light-emitting element 101a is pushed to the adhesive units 5a, 5b by the protrusion 30, and the first light-emitting element 101b is pushed to the adhesive units 5c, 5d by the protrusion 30. Referring to FIG. 5G, the first light-emitting elements 101a, 101b are pushed to the adhesive units 5a, 5b, 5c, 5d by the protrusions 30A, 30B, 30C. In an embodiment, the protrusion 30 does not push the first light-emitting element 101 away from the intermediate layer 3, but can be expanded to a height such that the first light-emitting element 101 directly contacts the adhesive unit 5. That is, the first light-emitting element 101 can simultaneously contact the adhesive unit 5 and the protrusion 30 during the transfer process.

Figure 6A:
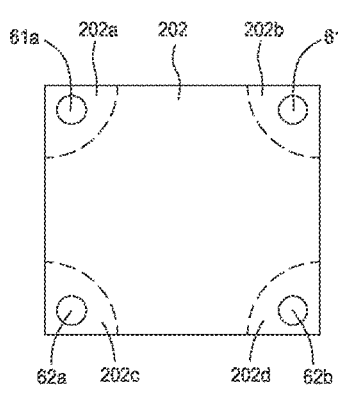
FIGS. 6A~6C show schematic views of spacer and substrate in accordance with one embodiment of the present disclosure.
Figure 6B:
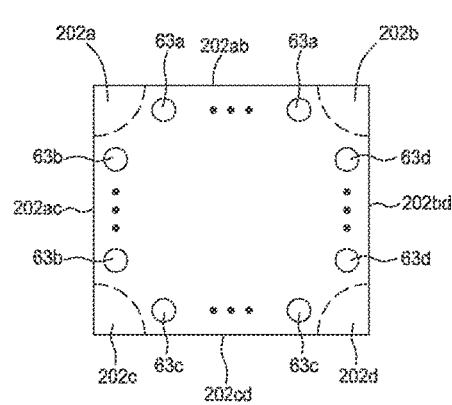
Figure 6C:
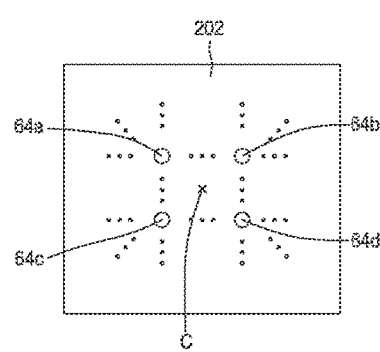

FIGS. 6A~6C show schematic views of spacer and substrate in accordance with one embodiment of the present disclosure. For the convenience of description, only the substrate and the spacer are marked, and the light-emitting element, the connecting portion and the adhesive unit are not indicated in FIGS. 6A~6C. Referring to FIG. 6A, the spacers 61a, 61b, 62a, 62b are positioned on the corners 202a, 202b, 202c, 202d of the second substrate 202. In an embodiment, the spacer can be placed at the areas other than the corner of the substrate. Referring to FIG. 6B, the spacers 63a, 63b, 63c, 63d are arranged near the edge sides 202ab, 202ac, 202cd, 202bd, and the spacers are not arranged on the corners 202a, 202b, 202c, 202d. In an embodiment, the spacer can be placed around the geometrical center of the substrate. Referring to FIG. 6C, the spacers 64a, 64b, 64c, 64d surround the geometrical center C of the second substrate 202 in a top view. The arrangement of the spacers is not limited to the patterns shown in FIGS. 6A~6C, and the patterns in FIGS. 6A~6C can be combined. For example, the patterns in FIGS. 6A, 6C are combined, and the spacers can be arranged on the corners and around the geometrical center of the substrate. Or, the patterns in FIGS. 6A, 6B are combined, and the spacers can be arranged on the corners and edge portions of the substrate. Or, the patterns in FIGS. 6B, 6C are combined, and the spacers can be arranged around the geometrical center of the substrate and edge portions of the substrate.

The manufacturing process disclosed in FIGS. 1A~1C, 2A~2C, 3A~3C, 4A~4G can incorporate the embodiment disclosed in FIGS. 5A~5G. That is, one or more protrusions 30 can be formed to push one or more first light-emitting elements 101 at once in the above manufacturing processes. One adhesive unit 5 can be formed to cover one or more connecting pads 104. One first light-emitting element 101 can be connected to one or more adhesive units 5.

The foregoing description has been directed to the specific embodiments of this disclosure. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A method of manufacturing a light-emitting device, comprising:
    providing a first substrate comprising an intermediate layer;
    providing a second substrate;
    placing a first light-emitting element on the intermediate layer;
    pushing the first light-emitting element toward the second substrate by forming at least two protrusions on the intermediate layer,
    wherein in a cross-sectional view, the at least two protrusions overlap with the first light-emitting element.

2. The method of claim 1, further comprising forming an adhesive unit on the second substrate before the pushing step.

3. The method of claim 2, wherein the adhesive unit contains an insulating material and conductive particles dispersed within the insulating material.

4. The method of claim 1, wherein the first light-emitting element is adhered to the second substrate after the pushing step.

5. The method of claim 1, further comprising placing a second light-emitting element on the intermediate layer, wherein the second light-emitting element remains on the first substrate after the pushing step.

6. The method of claim 5, further comprising placing a third light-emitting element on the second substrate, the third light-emitting element is overlapped with the second light-emitting element during the pushing step.

7. The method of claim 1, wherein the first substrate is separated from the second substrate by a distance which is twice larger than a height of the first light-emitting element during the pushing step.

8. The method of claim 1, further comprising arranging a spacer between the first substrate and the second substrate.

9. The method of claim 8, wherein the spacer is arranged on an edge of the second substrate.

10. The method of claim 8, wherein the spacer is arranged on a center of the second substrate.

11. The method of claim 1, wherein the first substrate and the intermediate layer are partially separated from each other after the pushing step.

12. The method of claim 1, wherein the first light-emitting element does not simultaneously contact both of the intermediate layer and the second substrate during the pushing step.

13. The method of claim 1, wherein the first light-emitting element has a plurality of electrode pads formed on a side opposite to the first substrate.

14. The method of claim 13, wherein the first light-emitting element is connected to the intermediate layer through a unit substrate.

15. The method of claim 14, wherein the unit substrate has a width larger than that of the first light-emitting element.

16. The method of claim 14, wherein in the pushing step, the unit substrate and the first light-emitting element are both pushed toward the second substrate.

17. The method of claim 1, wherein the at least two protrusions are formed by applying laser to the intermediate layer.

18. The method of claim 1, wherein the intermediate layer comprises a bubble layer and an adhesive structure, and the bubble layer is between the first substrate and the adhesive structure.

19. The method of claim 18, wherein the first light-emitting element is connected to the adhesive structure before the pushing step.

20. The method of claim 18, wherein, in the pushing step, the bubble layer is heated to bulge to form the at least two protrusions.

* * * * *